United States Patent

Tateyama et al.

[11] Patent Number: 5,817,156
[45] Date of Patent: Oct. 6, 1998

[54] SUBSTRATE HEAT TREATMENT TABLE APPARATUS

[75] Inventors: Kiyohisa Tateyama; Osamu Hirose, both of Kumamoto, Japan

[73] Assignees: Tokyo Electron Limited, Tokyo; Tokyo Electron Kyushu Limited, Tosu, both of Japan

[21] Appl. No.: 548,151

[22] Filed: Oct. 25, 1995

[30] Foreign Application Priority Data

Oct. 26, 1994 [JP] Japan ..................................... 6-285897

[51] Int. Cl.⁶ .................................................. H01L 21/68
[52] U.S. Cl. ................................... 29/25.01; 250/492.22; 118/725
[58] Field of Search ........................... 29/25.01; 438/796, 438/799; 250/492.22, 492.23; 118/725

[56] References Cited

U.S. PATENT DOCUMENTS 5,201,653  4/1993  Hasegawa et al. .
5,680,502  10/1997  Kim .
5,702,264  12/1997  Liao et al. .

FOREIGN PATENT DOCUMENTS 2-290013  11/1990  Japan .

*Primary Examiner*—David Graybill
*Attorney, Agent, or Firm*—Oblon, Spivak, McClelland, Maier & Neustadt, P.C.

[57] ABSTRACT

A substrate treatment apparatus according to an aspect of the invention includes a table for placing thereon an object to be treated, heating means for heating the object with the table interposed therebetween, and a plurality of support members which project from the table for supporting the object with a space interposed between the object and the table. The height of each of the support members can be varied in accordance with a surface temperature distribution of the object during treatment. A substrate treatment apparatus according to another aspect of the invention includes a table for placing thereon an object to be treated, and heating means for heating the object with the table interposed therebetween. The table has a surface thereof divided into regions of different heat radiation states in accordance with a surface temperature distribution of the object during treatment of the object.

18 Claims, 5 Drawing Sheets

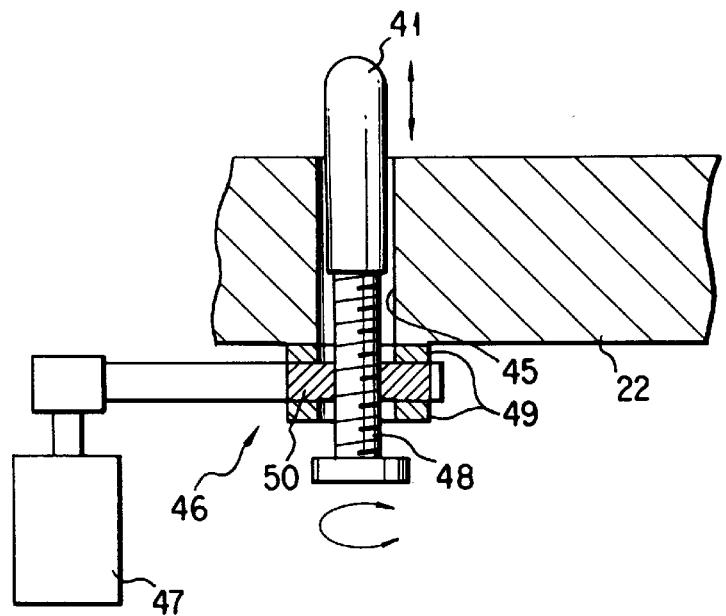
F I G. 5
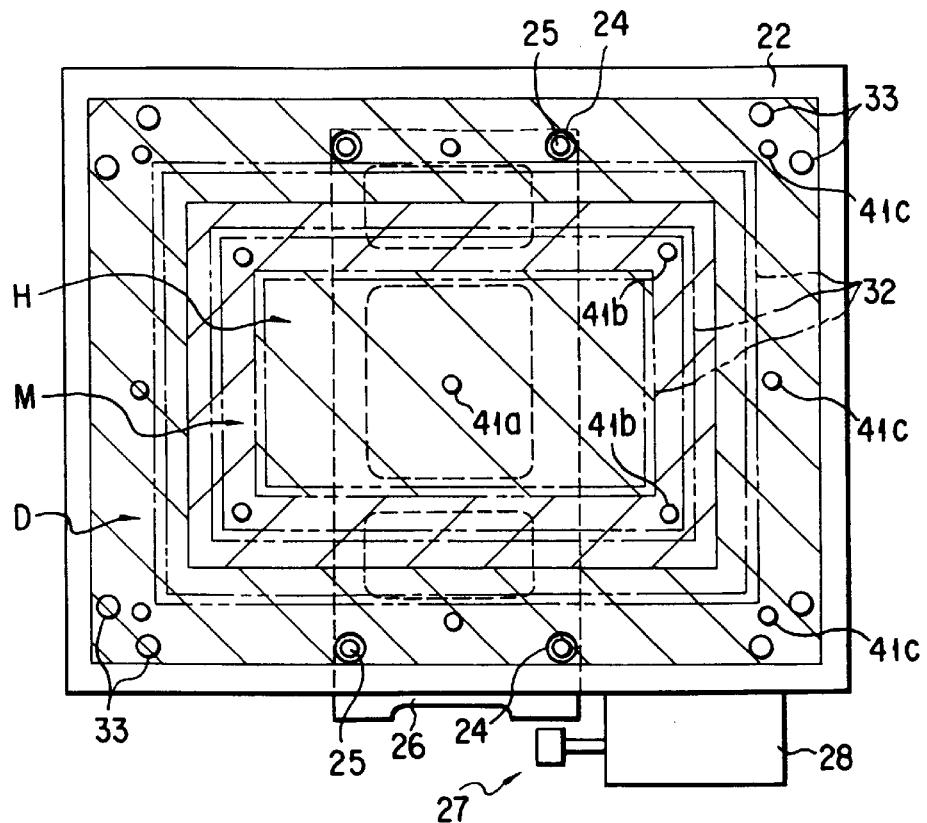
F I G. 6

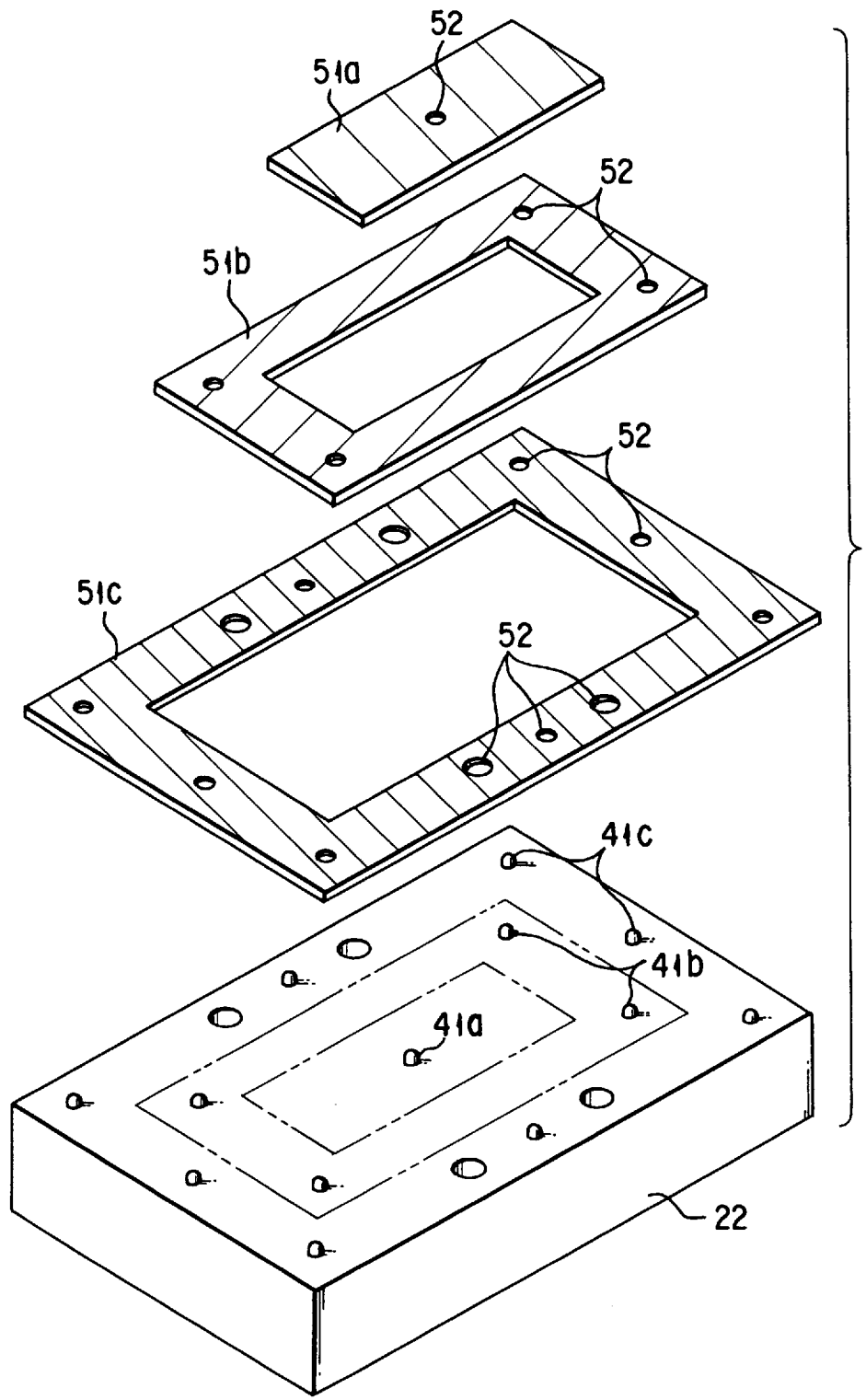
F I G. 7

SUBSTRATE HEAT TREATMENT TABLE APPARATUS

BACKGROUND OF THE INVENTION

1. Field of the Invention

This invention relates to a substrate treatment apparatus for treating an object such as an LCD (Liquid Crystal Display) substrate or a semiconductor substrate.

2. Description of the Related Art

In a process for manufacturing LCD devices, a photolithography technique, which is generally used in a process for manufacturing semiconductor devices, is employed to perform, on an LCD substrate (glass substrate), patterning of an electrode or a metal wire consisting of e.g. an ITO (Indium Tin Oxide) thin film. In this technique, a series of treatments are performed, wherein a photoresist film is formed on the LCD substrate, and a minificated circuit pattern is printed and developed thereon.

More specifically, a rectangular LCD substrate to be treated is cleaned in a cleaner apparatus, then subjected to a hydrophobic nature imparting treatment in an adhesion treatment apparatus, and cooled in a cooling apparatus. Subsequently, a photoresist film, i.e. a photosensitive film, is formed on the LCD substrate in a resist coating apparatus. The photoresist film is then heated or baked in a heating apparatus. Thereafter, the LCD substrate is exposed to light in an exposure apparatus to print a predetermined pattern thereon. This pattern is then developed using a developer, and the developer is then rinsed by a rinsing liquid.

In a series of treatments as above, a table called a "hot plate", which has a resistor heater embedded therein, is provided in the heating apparatus. The table can be set to a predetermined temperature, e.g. 200° C. At the time of heating the LCD substrate, it is placed directly on the hot plate or with a proximity gap interposed therebetween.

However, since in the above-described conventional heating apparatus, heat can easily escape from edge portion of the LCD substrate, the LCD substrate will not have the same temperature all over the surface. In other words, a center portion of the substrate will have a relatively high temperature, while a peripheral portion of the same will have a relatively low temperature. The resultant photoresist film will inevitably have an insufficiently heated portion which cannot be patterned in a reliable manner. As a result, the yield of product may well be reduced. To enable the substrate treatment apparatus to control the flow of gas in the vicinity of the peripheral portion of the LCD substrate so as to avoid such an uneven temperature distribution, the apparatus must be made complicated in structure and hence large in size.

SUMMARY OF THE INVENTION

The present invention has been developed under the above-described circumstances, and aims to provide a substrate treatment apparatus of a simple structure capable of heating an object uniformly.

To attain the object, there is provided a substrate treatment apparatus according to an aspect of the invention, which comprises: a table for placing thereon an object to be treated; heating means for heating the object with the table interposed therebetween; and a plurality of support members which project from the table for supporting the object with a space interposed between the object and the table; and wherein the height of each of the support members can be varied in accordance with a surface temperature distribution of the object during treatment.

The object can be also achieved by a substrate treatment apparatus according to another aspect of the invention, which comprises: a table for placing thereon an object to be treated; and heating means for heating the object with the table interposed therebetween; and wherein the table has a surface thereof divided into regions of different heat radiation states in accordance with a surface temperature distribution of the object during treatment of the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a cross sectional view, showing an essential part of a heating apparatus according to another embodiment of the invention;

FIGS. 6 and 8 are plan views, each showing an essential part of a heating apparatus according to a further embodiment of the invention;

FIG. 7 is a partially exploded perspective view, showing an essential part of a heating apparatus of a structure differing from that of FIG. 6.

DETAILED DESCRIPTION OF THE PREFERRED EMBODIMENTS

Figure 1:
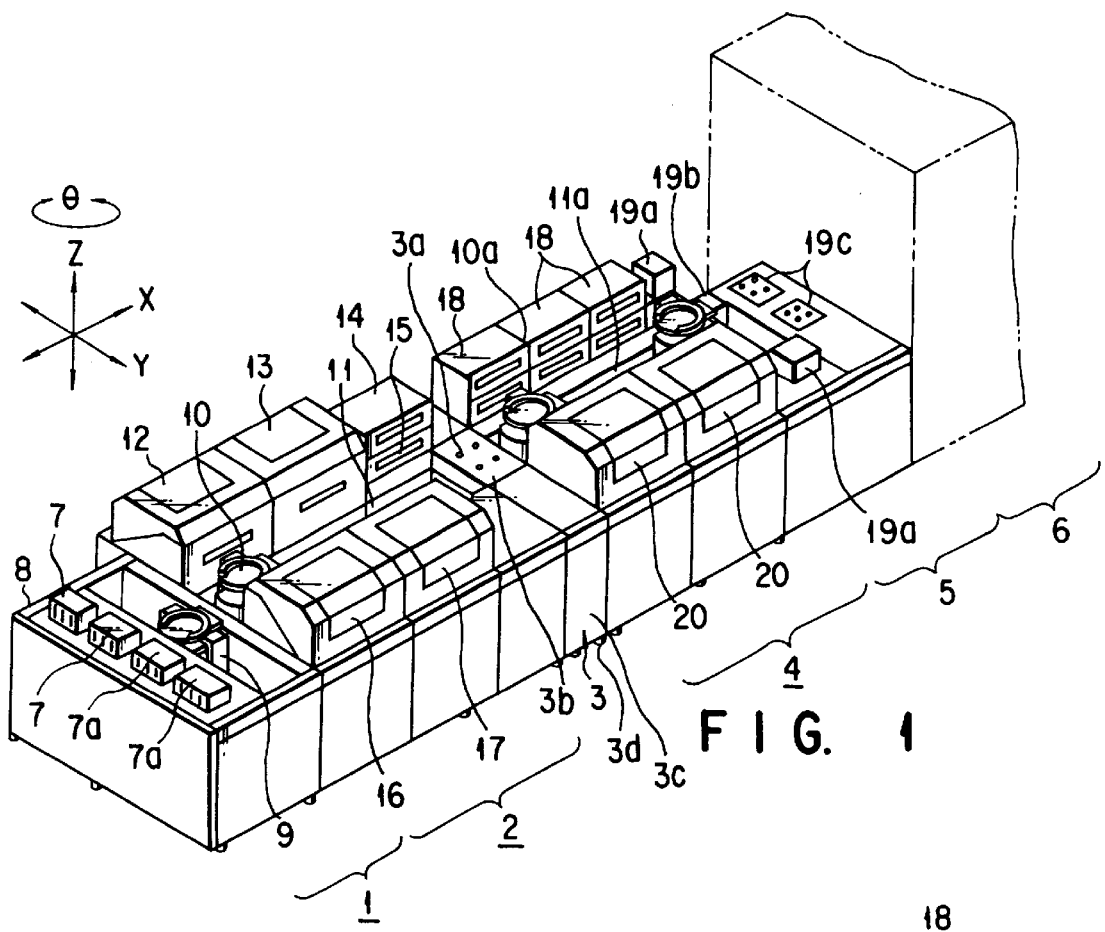
FIG. 1 is a perspective view, showing a coating/developing treatment system for LCDS, to which a substrate treatment apparatus according to the invention is applied.

A substrate treatment apparatus according to the invention is characterized by comprising a table for placing thereon an object to be treated, heating means for heating the object with the table interposed therebetween, and a plurality of support members which project from the table for supporting the object with a space interposed between the object and the table; and characterized in that the height of each support member can be varied in accordance with the surface temperature distribution of the object during treatment.

If the object has a temperature distribution in which a peripheral portion thereof has a higher temperature than a center portion thereof, those of the support members which support the center portion are set lower than those of the support members which support the peripheral portion. If, on the other hand, the peripheral portion has a lower temperature than the center portion, the support members which support the peripheral portion are set lower than the support members which support the peripheral portion. As a result, the heating means can efficiently transmit heat to a low temperature portion of the object. Actually, in consideration of heat loss due to escape of heat on the side of the peripheral portion, a greater amount of heat is radiated on the peripheral portion than on the center portion, thereby controlling the overall surface of the object to substantially the same temperature during treatment.

The support members may be fixed to the table or detachably mounted on the table, so long as a support member supporting a high-temperature region of the object is higher than a support member supporting an other region of the object. Further, the support members may be arranged such that they can be moved relative to the table. In this case, the support members can also function as vertically moving means for transfer the object. Moreover, if the support members can be moved individually, the height of each support member can be precisely adjusted depending upon the size or the thickness of the object.

Also, the support members may include fixed support members whose heights are fixed, and variable support members whose heights can be varied. In this case, the number or the positions of the support members are not strictly limited. It suffices if the support members which support a higher temperature portion of the object during treatment are taller than those which support a lower temperature portion.

The support members include support pins, proximity pins, etc.

In addition, the substrate treatment apparatus can further comprise driving means coupled with the support members for changing the height of each support member, temperature measurement means for measuring the temperature of each surface portion of the object during treatment, and control means electrically connected to the driving means and the temperature measurement means for varying the height of each support member on the basis of temperature data supplied from the temperature measurement means. By virtue of this structure, while the surface temperature distribution of the object is detected, the height of each support member can be adjusted, thereby keeping the overall surface of the object at substantially the same temperature during treatment. Thus, the reliability of treatment can be enhanced.

Furthermore, the substrate treatment apparatus is characterized by comprising a table for placing thereon an object to be treated, and heating means for heating the object via the table whose surface is divided into regions of different heat radiation states in accordance with the surface temperature distribution of the object during treatment.

To create the different heat radiation states, there are a method for creating regions of different brightnesses in accordance with the surface temperature distribution of the object during treatment, and a method for creating regions of different surface roughnesses in accordance with the surface temperature distribution of the object during treatment.

In the case of the method for creating regions of different brightnesses on the table, that portion of the table which corresponds to a lower temperature portion of the object during treatment is set to a lower brightness. For example, where a peripheral portion of the object has a higher temperature than a center portion of the same, that region of the table which corresponds to the center portion of the object is set to a lower brightness than that region of table which corresponds to the peripheral portion of the object. On the other hand, where the peripheral portion of the object has a lower temperature than the center portion of the same, that region of the table which corresponds to the peripheral portion of the object is set to a lower brightness than that region of table which corresponds to the center portion of the object. In other words, the lower the brightness, the higher the heat emissivity and hence the greater the heating amount of the object.

In the case of the method for creating regions of different surface roughnesses on the table, that portion of the table which corresponds to a lower temperature portion of the object during treatment is set to a higher roughness. For example, where a peripheral portion of the object has a higher temperature than a center portion of the same, that region of the table which corresponds to the center portion of the object is set to a higher roughness than that region of table which corresponds to the peripheral portion of the object. On the other hand, where the peripheral portion of the object has a lower temperature than the center portion of the same, that region of the table which corresponds to the peripheral portion of the object is set to a higher roughness than that region of table which corresponds to the center portion of the object. In other words, the rougher the surface, the higher the heat emissivity and hence the greater the heating amount of the object.

The above methods enables the heating means to radiate a greater amount of heat to a lower temperature portion of the object than that to a higher temperature portion. Actually, in consideration of heat loss due to escape of heat on the side of the peripheral portion, a greater amount of heat is radiated on the peripheral portion of the object than on the center portion, thereby controlling the overall surface of the object to substantially the same temperature during treatment.

The embodiments of the invention will now be explained in detail with reference to the accompanying drawings. In the embodiments, substrate treatment apparatuses according to the invention are applied to a coating/developing treatment system for LCD substrates.

As is shown in FIG. 1, the coating/developing treatment system mainly comprises a loader section 1 for transferring an LCD substrate G to be treated (hereinafter called simply a "substrate") into and out of a first treatment section 2, the first treatment section 2 for treating the substrate G, and a second treatment section 4 connected to the first treatment section 2 via a relay section 3. An exposure device 6 for exposing a resist film to form a predetermined fine pattern can be connected to the second treatment section 4 via a transfer section 5.

The loader section 1 is constituted by a cassette table 8 for placing thereon a cassette 7 for containing substrates G to be treated and a cassette 7a for containing treated substrates G, and a substrate transfer pincette 9 movable in the horizontal direction (X-Y direction) and in the vertical direction (Z-direction) and also rotatable as indicated by the arrow θ.

In the first treatment section 2, there is provided a main arm 10 which is movable in the X, Y and Z directions and rotatable in the direction θ. On one side of the transfer passage 11 of the main arm 10, there are provided a brush cleaning apparatus 12 for cleaning the substrate G using a brush, a jet cleaning apparatus 13 for cleaning the substrate G using water jet, an adhesion treatment apparatus 14 for imparting the surface of the substrate G with hydrophobic nature, and a cooling apparatus 15 for dolling the substrate G to a predetermined temperature. Further, on the other side of the transfer passage 11, there are provided a resist coating apparatus 16 and a coated film-removing apparatus 17.

Similar to the first treatment section 4, the second treatment section 4 has a main arm 10a which is movable in the X, Y and Z directions and rotatable in the direction θ. On one side of the transfer passage 11a of the main arm 10a, there is provided a substrate treatment apparatus 18 according to the invention for heating the substrate G before and after a resist coating treatment (i.e. for performing pre-baking and post-baking). Further, there is provided a developing apparatus 20 on the other side of the transfer passage 11a of the main arm 10a.

The relay section 3 is constituted by a box-shaped body 3c, a transfer table 3b provided on the body 3c, support pins 3a projecting from the table 3b for supporting the substrate G, and casters 3d provided on the lower surface of the bottom of the body 3c. The relay section 3 can be detached to separate the first and second treatment sections 2 and 4, so that the operator can repair or inspect the first and second treatment sections 2 and 4 with ease.

The transfer section 5 is constituted by a cassette 19a for temporarily allowing the substrate G to wait therein, a transfer pincette 19b for transferring the substrate G to and from the cassette 19a, and a transfer table 19c for transferring the substrate G.

In the coating/developing treatment system constructed as above, each to-be-treated substrate G contained in the cassette 7 is pulled therefrom by the transfer pincette 9 of the loader section 1, then transferred to the main arm 10 of the first treatment section 2, and introduced into the brush cleaning apparatus 12. After a brushing treatment in the apparatus 12, the substrate G is further cleaned, if necessary, by a high pressure water jet in the jet cleaning apparatus 13. Subsequently, the substrate G is imparted with hydrophobic nature in the adhesion treatment apparatus 14, then cooled in the cooling apparatus 15, and coated with a photoresist film in the resist coating apparatus 16. Thereafter, that unnecessary portion of the photoresist film which is formed in the vicinity of a peripheral portion of the substrate G is removed by a coated film-removing apparatus 17. The remaining photoresist film is heated or baked in the heating apparatus 18, and exposed in the exposure apparatus 6 to print a predetermined pattern thereon. The exposed substrate G is transferred into the developing apparatus 20, where development is performed using a developer. Thereafter, the developer is rinsed using a rinsing liquid. Thus, the developing treatment is completed. The developed substrate G is received in the cassette 7a of the loader section 1 and transferred to the next treatment place.

The substrate treatment apparatuses of the invention which are applied to the above-described coating/developing treatment system for the LCDs will be explained.

Figure 2:
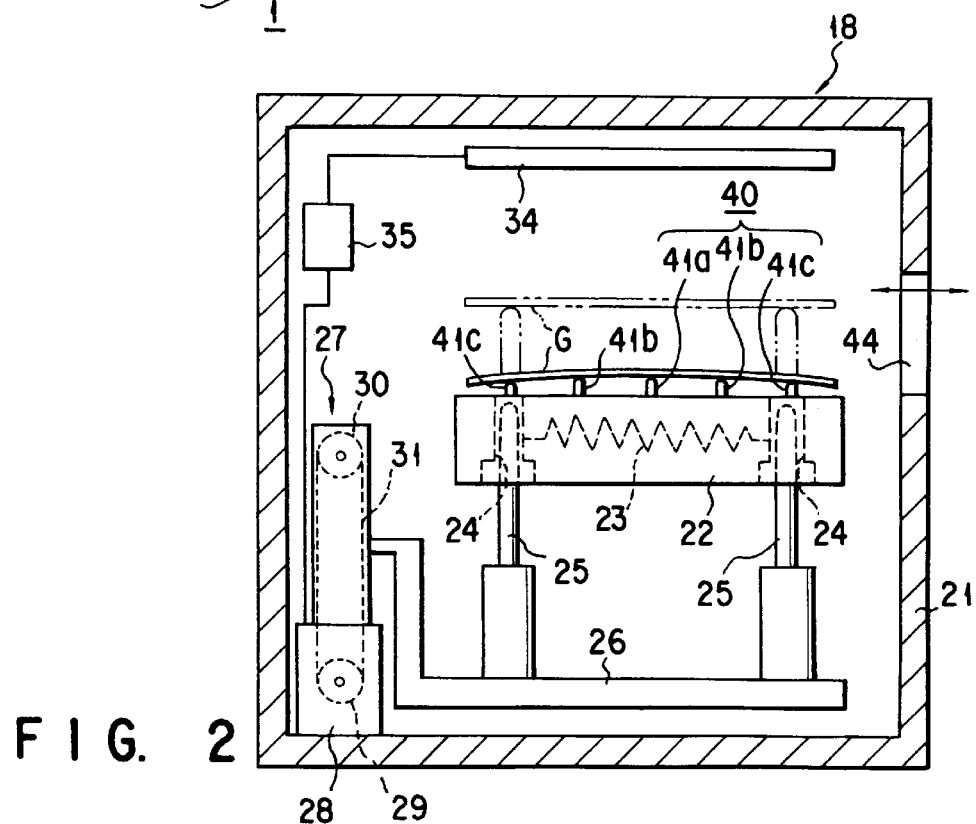
FIG. 2 is a schematic view, showing a substrate treatment apparatus according to an embodiment of the invention.
Figure 3:
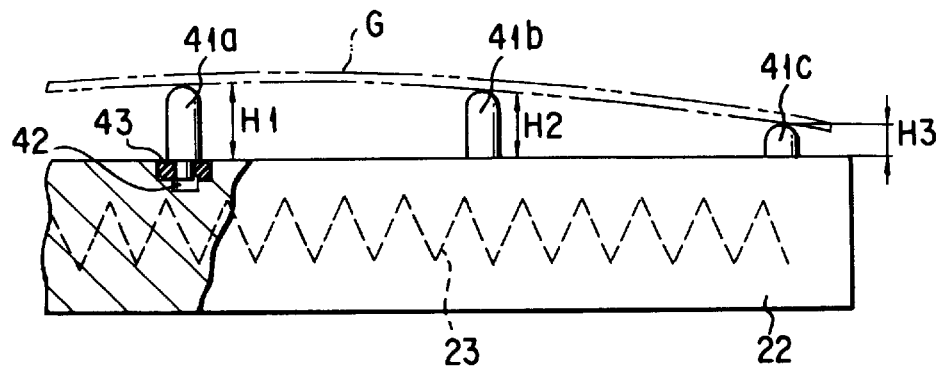
FIG. 3 is a partially enlarged sectional view, showing an essential part of the substrate treatment apparatus of FIG. 2.

FIG. 2 is a schematic view, showing a substrate treatment apparatus according to an embodiment of the invention; FIG. 3 is a partially enlarged sectional view, showing an essential part of the substrate treatment apparatus of FIG. 2; and FIG. 4 is a plan view, showing an essential part of the apparatus of FIG. 2.

In the heating apparatus 18, a table 22 for placing thereon the substrate G (hereinafter called a "hot plate") is contained in a box-shaped case 21. The hot plate 22 is made, for example, of an aluminum alloy, and has a heater (heating means) 23 embedded therein, and a temperature sensor (not shown) provided therein. With this structure, the hot plate can be set to a predetermined temperature, e.g. 200° C.

A plurality (e.g. four) of through holes 24 are formed in the hot plate 22, and a vertically moving pin 25 is received in each hole 24 for transferring the substrate. The vertically moving pins 25 each have its lower end portion fixed to a coupling guide 26, which is coupled with a vertical movement mechanism 27. The mechanism 27 is constituted by a stepping motor 28 serving as a driving motor, a driving pulley 29 to be driven by the motor 28, a driven pulley 30 provided above the driving pulley 29, and a timing belt 31 bridging the driving and driven pulleys 29 and 30 and coupled with the coupling guide 26. Thus, the vertically moving pins 25 can vertically move in accordance with the forward and backward rotation of the stepping motor 28.

Figure 4:
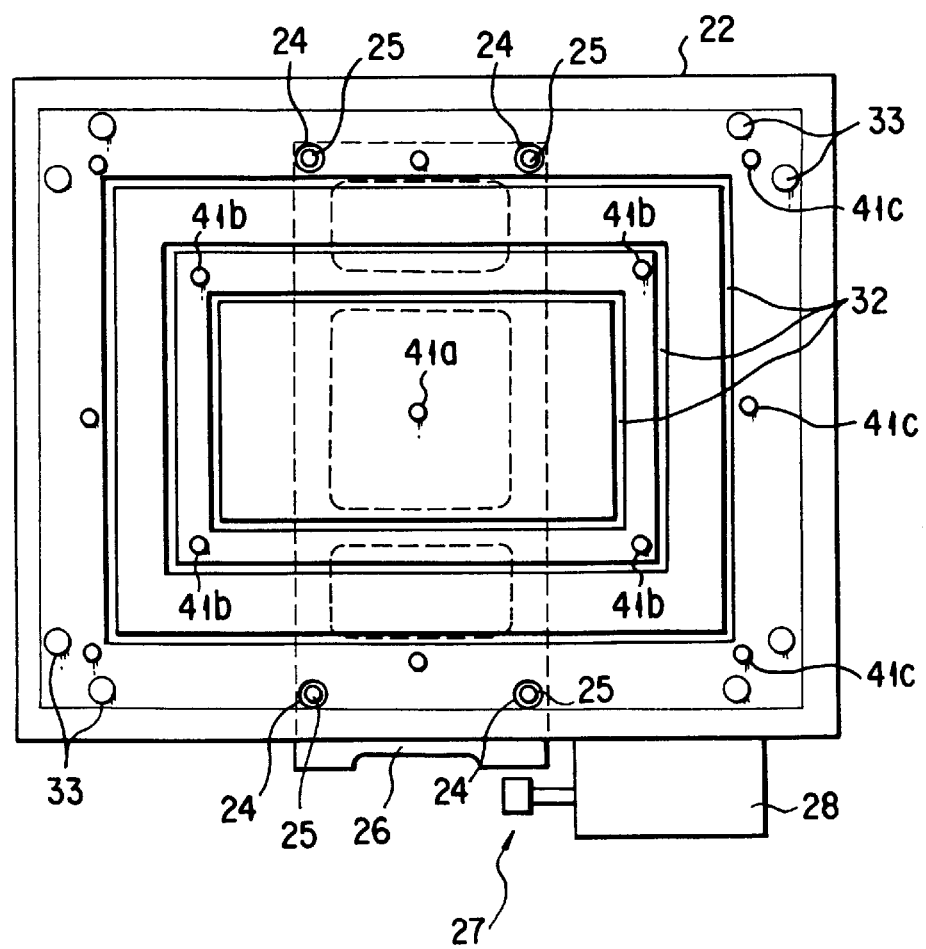
FIG. 4 is a plan view, showing an essential part of the apparatus of FIG. 2.

As is shown in FIG. 4, a plurality ("three" in the FIG. 4 case) of rectangular vacuum chuck grooves 32 which each have a width of 1 mm and a depth of 1 mm are formed concentric in the upper surface of the hot plate 22. These grooves 32 are provided for holding, by a vacuum force, substrates G of different types and sizes.

Further, there are provided, on the upper surface of the hot plate 22, guide pins 33 to be engaged with edge portions of the substrate G, and support means 40 projecting therefrom to provide a proximity gap between the substrate G and the hot plate 22. The support means 40 is constituted by a plurality of support members such as a first support pin 41a located at a center portion of the hot plate 22, four second support pins 41b arranged on intermediate portions of the hot plate 22 such that they are apart by the same distance from the first support pin 41a, and eight third support pins 41c located on peripheral portions of the hot plate 22. The support pins 41a–41c are made, for example, of a fluorocarbon resin of high heat resistance and high corrosion resistance, such as polytetrafluoroethylene (PTFE). Further, as is shown in FIG. 3, each of these support pins is detachably fitted in an insertion hole 42 formed in the upper surface of the hot plate 22, with a fitting ring 43 interposed therebetween. The hot plate 22 can deal with substrates of different sizes by changing the positions of the guide pins 33 and the support pins 41a–41c appropriately. Each support pin has a semispherical head or a needle head so that it can be brought into point contact with the substrate G. As a result, the amount of particles generated when the support pins contact the substrate G can be minimized. There is a case where some of the support pins 41a–41c are not used. In this case, dummy pins (or lids) are arranged in unused ones of the insertion holes 42.

Moreover, the heights of the support pins 41a–41c are controlled on the basis of that temperature distribution of radiation from the heater 23 to the substrate G, which is obtained when the same gap is interposed between the overall surface of the substrate G and the hot plate 22. As explained above, where the substrate is heated with the same gap from the hot plate, a peripheral portion of the substrate G inevitably has a lower temperature than a center portion of the same since heat can easily escape from the peripheral portion. In order to avoid this, as shown in FIGS. 2 and 3, the heights of the support pins 41a–41c are adjusted such that the relationship H1>H2>H3 is established (where Hi represents the height of the first support pin 41a located on a center portion, H2 the height of each of the second support pins 41b located on intermediate portions, and H3 the height of each of the support pins 41c located on peripheral portions). The heights are varied depending upon the size and/or the thickness of the substrate G. Specifically, if the substrate G has a size of 470 mm×370 mm, the height H1 of the first support pin 41a is set to 0.3 mm, the height H2 of the second support pin 41b to 0.25 mm, and the height H3 of the third support pin 41c to 0.2–0.15 mm.

Under the above-described conditions, the substrate G was heated by radiation of 120° C. from the heater 23. As a result, a center portion of the substrate G was 110° C., an intermediate portion of the same was 105° C., and a peripheral portion of the same was 100° C. Thus, the range of the temperature distribution (the in-plane heat distribution) of the substrate G was restricted within about 9%, which means that the overall surface of the substrate G was heated substantially uniformly.

A transfer port 44 with an openable/closable shutter is formed in a side wall of the case 21 for transferring the substrate G therethrough by means of a transfer arm (not shown).

Temperature measurement means 34 for measuring the temperature of each surface portion of the substrate G is located above a place at which the substrate G is to be received. The temperature measurement means 34 consists, for example, of a thermography which can measure an in-plane temperature distribution. The means 34 is electrically connected to the stepping motor 28 via control means 35.

The operation of the substrate treatment apparatus of the invention constructed as above will be explained. First, the hot plate is set to a predetermined temperature of e.g. about 200° C. The substrate G is transferred through the transfer port 44 onto the hot plate 22 by means of a transfer arm, etc. Then, the vertically moving pins 25 are raised (or the transfer arm is lowered) to support the substrate G thereon, and the transfer arm is retreated.

Subsequently, the vertically moving pins 25 are lowered to place the substrate G on the support pins 41a–41c which project from the hot plate 22. At the time of transfer the substrate G, the substrate G may be held temporarily with a vacuum force, in order to prevent its displacement from a predetermined position. In this state, the substrate G has its center portion held in a higher position than its peripheral portion. As a result, the substrate G can have a uniform temperature distribution, in other words, the substrate can be uniformly heated.

After the heating treatment for a predetermined period of time, the vertically moving pins 25 are raised to raise the substrate G from the hot plate 22. The raised substrate is received by the transfer arm, etc. introduced into the case 21 through the transfer port 44. When the substrate G has been transferred to the transfer arm as a result of lowing the vertically moving pins 25 (or raising the transfer arm), the transfer arm is retreated to the outside of the case 21, and transfers the substrate G to a place at which the next treatment is performed.

In the above-described embodiment, to uniformly heat the substrate G, the height of the first support pin 41a located at the center portion of the hot plate 22 is set taller than that of the second support pins 41b located at the intermediate portions and that of the third support pins 41c located at the peripheral portions. However, the setting of the heights of the support pins 41a–41c is not limited to the above. Alternatively, the heights of the support pins may be set in accordance with that temperature distribution of radiation from the heater 23 to the substrate G, which is obtained when the overall surface of the substrate is separated from the hot plate with the same gap therebetween. For example, where the temperature of radiation from the heater 23 to a center portion of the substrate G is lower than that of radiation to a peripheral portion of the same, the first support pin 41a located at the center of the hot table is set lower than the third support pins 41c located at the peripheral portions.

FIG. 5 is a sectional view, showing an essential part of a substrate treatment apparatus according to another embodiment of the invention. In this embodiment, the height of that portion of each of the support pins 41a–41c (hereafter represented by "41"), which project from the hot table 22, can be varied. Specifically, a through hole 45 is formed in the hot plate 22 for allowing each support pin 41 to vertically move therethrough. Further, the support pin 41 is connected via a ball screw mechanism 46 to a stepping motor 47 which functions as a height-adjusting motor. The ball screw mechanism 46 is constituted by a screw shaft 48 forming a lower portion of the pin 41, and a nut 50 attached to the lower surface of the hot table with a bearing 49 interposed therebetween, and rotatably inserting the screw shaft 48 therethrough.

As described above, the height of the support pin 41 can be varied relative to the upper surface of the hot plate 22. The support pin has its height adjusted in accordance with different temperature distributions of substrates G due to their different sizes and thicknesses, with the result that a heat treatment can be performed in which the temperature of radiation to the substrate G is varied in a stepwise manner. Furthermore, the overall surface of the substrate G can be controlled during treatment so as to have substantially the same temperature, by measuring the temperature of each surface portion of the substrate G by means of the temperature measurement means 34 during treatment and controlling the stepping motor 28 by the control means 35 on the basis of temperature data from the temperature measurement means 34. In addition, increasing the range of vertical movement of the support pin 41 enables itself to serves as a vertically moving pin, too. As a result, the number of the component parts of the apparatus can be reduced, and hence the apparatus can be made compact in size. The ball screw mechanism can be used in place of the vertical movement mechanism 27.

In the height adjustment of the support pins 41, the heights of the pins 41 may be adjusted individually or in units of the first support pin 41a, the second support pins 41b and the third support pins 41c, respectively. Alternatively, the first through third support pins 41a–41c may be set to have the same height, and are simultaneously moved to perform height adjustment of the substrate. Moreover, the apparatus may be modified such that it includes a fixed support member whose height from the hot plate 22 is fixed, and a variable support member whose height can be varied, and that the variable support member is connected to the stepping motor 28.

Although in the above-described embodiment, the height of each support pin 41 is adjusted by vertically moving the same, the apparatus may be modified such that the support pin 41 is fixed and the hot plate 22 can be vertically moved. Further, both the support pin and the hot plate may be arranged movable.

In the embodiment, the heating treatment can be modified such that the portion of the substrate G to which high temperature radiation is applied is changed with the passage of time, by controlling the vertical movement of the support pins so as to change the place at which the distance between the hot plate 22 and the substrate G is adjusted.

FIG. 6 is a plan view, showing an essential part of a substrate treatment apparatus according to a further embodiment of the invention; and FIG. 7 is a partially exploded perspective view, showing an essential part of a substrate treatment apparatus according to a yet another embodiment of the invention. In these embodiments, an object of a substantially uniform temperature distribution is obtained by forming regions of different brightnesses in the hot plate 22 to thereby control the amounts of radiation from the regions to the object. Specifically, the surface of the hot plate 22 is divided into a center region H, an intermediate region M concentric with the center region H, and a peripheral region D concentric with the regions H and M. If a center portion of the substrate G has a higher temperature than a peripheral portion of the same where the overall surface of the hot plate is set to the same brightness, the brightness of the center region H is set to a highest value (i.e. the region H is made "white"), the brightness of the intermediate region M to an intermediate value (i.e. the region M is made "gray"), and the brightness of the peripheral region D to a lowest value (i.e. the region D is made "black"). As a result, the amount of heat radiated from the heater 23 gradually increases in the direction from the center region H through the intermediate region M to the peripheral region D. Accordingly, the substrate G can have a uniform temperature distribution, i.e. the entire substrate G can be heated uniformly.

The brightness of the hot plate 22 can be varied by subjecting the surface of the plate to the Tuframe treatment, or by printing thereon a paint of high heat resistance. Further, as is shown in FIG. 7, the surface of the hot plate 22 can be divided into regions of different brightnesses, for example, by attaching to the plate frame members 51a–51c coated with "white", "gray" and "black", respectively. In this case, guide holes 52 for the support pins 41 and the vertically moving pins 25 are formed in the frame members 51a–51c.

Although in the above case, the hot plate 22 is divided into three regions of different brightnesses, it should be divided into four or more regions of different brightnesses if more precise temperature control is intended. Moreover, in this embodiment, the brightness of the hot plate 22 is gradually reduced in the direction from the center region to the peripheral region. If, however, the temperature of the center portion of the substrate G is intended to be made higher than that of the peripheral portion of the same, the brightness is gradually increased in the same direction as above. Since in this embodiment, the structural elements are similar to those employed in the other embodiments except that the support pins 41 have the same height, they are denoted by corresponding reference numerals and no explanations are given thereof.

Figure 8:
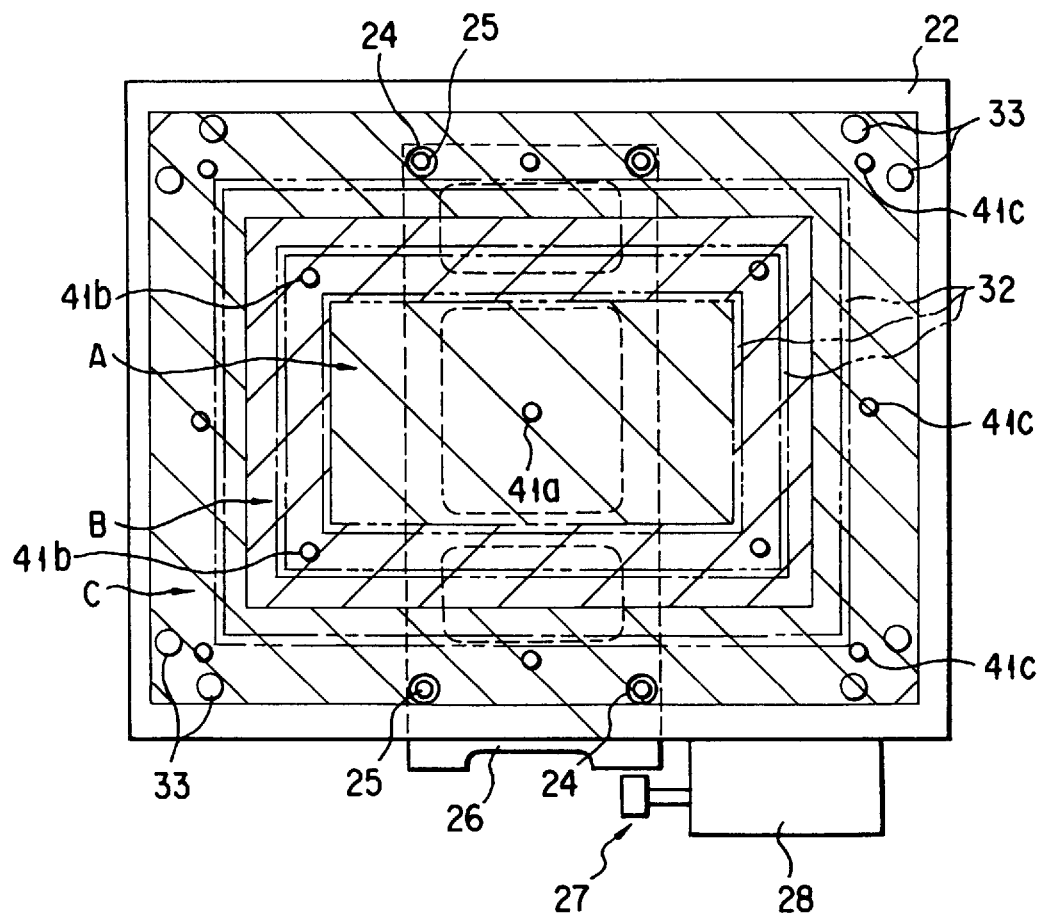
Figure 9:
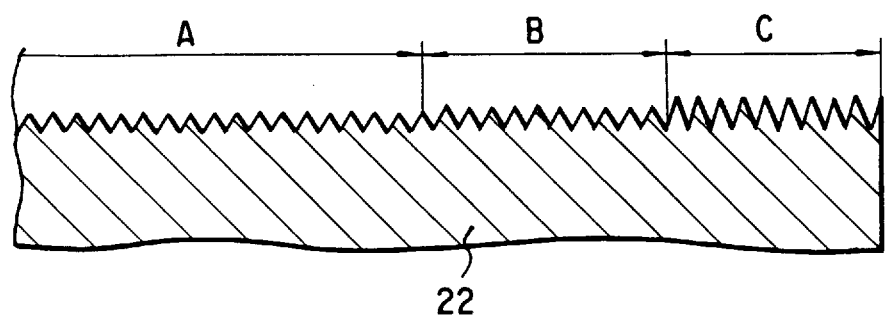
FIG. 9 is a partially enlarged sectional view, showing an essential part of the heat apparatus of FIG. 8.

FIG. 8 is a plan view, showing an essential part of a heating apparatus according to a further embodiment of the invention; and FIG. 9 is a partially enlarged sectional view, showing an essential part of the heat apparatus of FIG. 8. In this embodiment, the amount of radiation from the hot plate 22 is controlled by forming regions of different roughnesses in the plate 22, thereby to enable an object to have a uniform temperature distribution, i.e., to be heated uniformly. Specifically, the surface of the hot plate 22 is divided into a center region A, an intermediate region B concentric with the center region A, and a peripheral region C concentric with the regions A and B. If a center portion of the substrate G has a higher temperature than a peripheral portion of the same where the overall surface of the hot plate is set to the same roughness, the roughness of the center region A is set to a lowest value (i.e. the region A has a smallest surface area), the roughness of the intermediate region B to an intermediate value (i.e. the region B has an intermediate surface area), and the roughness of the peripheral region C to a highest value (i.e. the region C has a largest surface area). As a result, the amount of heat radiated from the heater 23 gradually increases in the direction from the center region A through the intermediate region B to the peripheral region C. Accordingly, the substrate G can have a uniform temperature distribution, i.e. the entire substrate G can be heated uniformly.

Although in this embodiment, the hot plate 22 is divided into three regions of different roughnesses, it should be divided into four or more regions of different roughnesses if more precise temperature control is intended. Moreover, in this embodiment, the roughness of the hot plate 22 is gradually reduced in the direction from the center region to the peripheral region. If, however, the temperature of the center portion of the substrate G is intended to be made higher than that of the peripheral portion of the same, the roughness is gradually increased in the same direction as above. Since in this embodiment, the structural elements are similar to those employed in the other embodiments except that the support pins 41 have the same height, they are denoted by corresponding reference numerals and no explanations are given thereof.

In the above-described embodiments, the amount of heat radiated from the hot plate 22 is controlled so as to increase the temperature of a center portion of the substrate G and to reduce the temperature of a peripheral portion thereof (or vice versa), thereby controlling the overall surface of the substrate G to substantially the same temperature, if the temperature of the center portion of the substrate is higher than that of the peripheral portion (or vice versa) where the technical means employed therein are not used. However, the treatment apparatus may be modified such that the temperature of heat radiated on the substrate G is partially controlled.

For example, in order to heat a particular region of the substrate G at a higher temperature than the other regions, the distance between the hot plate 22 and that particular region of the substrate G is set smaller than the distances between the plate 22 and the other regions of the substrate. Alternatively, that portion of the hot plate 22 which corresponds to the particular region of the substrate is set to a higher brightness than the other portions of the plate 22, or set to a greater roughness than the other portions of the plate 22. On the other hand, in order to heat a particular region of the substrate G at a lower temperature than the other regions, the distance between the hot plate 22 and that particular region of the substrate G is set larger than the distances between the plate 22 and the other regions of the substrate. Alternatively, that portion of the hot plate 22 which corresponds to the particular region of the substrate is set to a lower brightness than the other portions of the plate 22, or set to a lower roughness than the other portions of the plate 22.

As described above, the substrate G can be heated uniformly all over the surface or ununiformly by controlling the surface temperature distribution of the same. Thus, various types of heating can be performed in accordance with the size and/or shape of the substrate G.

Although in the embodiments, the substrate treatment apparatuses are applied to the coating/developing treatment system for LCDs, they can be also used only singly. Furthermore, they are also applicable to a prober apparatus, an ashing apparatus, an exposure apparatus, etc. The substrate treatment apparatuses can treat a semiconductor substrate such as a silicon wafer, too.

In summary, the substrate treatment apparatus according to an aspect of the invention comprises a table for placing thereon an object to be treated, heating means for heating the object with the table interposed therebetween, and a plurality of support members which project from the table for supporting the object with a space interposed between the object and the table. The height of each support member can be varied in accordance with the surface temperature distribution of the object during treatment. Therefore, heat radiated from the heating means to the object can be controlled so as to uniformly heat the overall surface of the object. As a result, the yield of product can be increased.

In addition, the substrate treatment apparatus according to another aspect of the invention comprises a table for placing thereon an object to be treated, and heating means for heating the object via the table whose surface is divided into regions of different radiation states in accordance with the surface temperature distribution of the object during treatment. Therefore, heat radiated from the heating means to the object can be controlled so as to uniformly heat the overall surface of the object. As a result, the yield of product can be increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate treatment apparatus comprising:

a table for placing thereon an object to be treated; heating means for heating the object with the table interposed therebetween; and a plurality of support members which project from the table for supporting the object with a space interposed between the object and the table; and wherein the height of each of the support members can be varied in accordance with a surface temperature distribution of the object during treatment.

2. The apparatus according to claim 1, wherein the table and each of the support members are movable relative to each other.

3. The apparatus according to claim 1, wherein the support members include a fixed support member whose height from the table is fixed, and a variable support member whose height from the table is varied.

4. The apparatus according to claim 1, wherein the support members consist of support pins.

5. The apparatus according to claim 1, wherein the object is one of a semiconductor substrate and an LCD substrate.

6. The apparatus according to claim 1, wherein a resist film formed on the object is baked in the heating treatment.

7. A substrate treatment apparatus comprising:

a table for placing thereon an object to be treated; heating means for heating the object with the table interposed therebetween; a plurality of support members which project from the table for supporting the object with a space interposed between the object and the table; driving means coupled with the support members for changing the height of each support member, temperature measurement means for measuring the temperature of each surface portion of the object during treatment, and control means electrically connected to the driving means and the temperature measurement means for varying the height of each support member on the basis of temperature data supplied from the temperature measurement means.

8. The apparatus according to claim 7, wherein the support members include a fixed support member whose height from the table is fixed, and a variable support member whose height from the table is varied.

9. The apparatus according to claim 7, wherein the support members consist of support pins.

10. The apparatus according to claim 7, wherein the object is one of a semiconductor substrate and an LCD substrate.

11. The apparatus according to claim 7, wherein a resist film formed on the object is baked in the heating treatment.

12. A substrate treatment apparatus comprising:

a table for placing thereon an object to be treated; and heating means for heating the object with the table interposed therebetween; and wherein the table has a surface thereof divided into regions of different heat radiation states in accordance with a surface temperature distribution of the object during treatment of the object.

13. The apparatus according to claim 12, the surface of the table is divided into regions of different brightnesses in accordance with a surface temperature distribution of the object during treatment of the object.

14. The apparatus according to claim 13, wherein that portion of the table which corresponds to a lower temperature surface portion of the object than the other surface portion of the object is set to have a lower brightness than the other portion of the table.

15. The apparatus according to claim 12, the surface of the table is divided into regions of different roughnesses in accordance with a surface temperature distribution of the object during treatment of the object.

16. The apparatus according to claim 15, wherein that portion of the table which corresponds to a lower temperature surface portion of the object than the other surface portion of the object is set to have a greater roughness than the other portion of the table.

17. The apparatus according to claim 12, wherein the object is one of a semiconductor substrate and an LCD substrate.

18. The apparatus according to claim 12, wherein a resist film formed on the object is baked in the heating treatment.

* * * * *